(12) United States Patent
Zhou et al.

(10) Patent No.: US 8,778,744 B2
(45) Date of Patent: Jul. 15, 2014

(54) METHOD FOR MANUFACTURING SEMICONDUCTOR FIELD EFFECT TRANSISTOR

(75) Inventors: Huajie Zhou, Beijing (CN); Qiuxia Xu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 210 days.

(21) Appl. No.: 13/395,743

(22) PCT Filed: Nov. 18, 2011

(86) PCT No.: PCT/CN2011/082421
§ 371 (c)(1),
(2), (4) Date: Mar. 13, 2012

(87) PCT Pub. No.: WO2012/174822
PCT Pub. Date: Dec. 27, 2012

(65) Prior Publication Data
US 2012/0329218 A1  Dec. 27, 2012

(30) Foreign Application Priority Data
Jun. 24, 2011 (CN) .......................... 2011 1 0172967

(51) Int. Cl.
*H01L 21/336* (2006.01)
*H01L 29/66* (2006.01)
*H01L 29/78* (2006.01)

(52) U.S. Cl.
CPC ........ *H01L 29/66795* (2013.01); *H01L 29/785* (2013.01)
USPC .... 438/151; 438/166; 438/300; 257/E21.619; 257/E21.634

(58) Field of Classification Search
CPC .................. H01L 29/785; H01L 29/66795
USPC .................. 438/300, 151, 166; 257/E21.619, 257/E21.634
See application file for complete search history.

(56) References Cited

U.S. PATENT DOCUMENTS 3,931,435 A * 1/1976 Gipstein et al. ............... 430/296
6,858,478 B2 * 2/2005 Chau et al. ..................... 438/149

(Continued)

FOREIGN PATENT DOCUMENTS

| CN | 1731589 A | 2/2006 |
| CN | 100533758 C | 8/2009 |
| CN | 100546042 C | 9/2009 |

OTHER PUBLICATIONS

International Search Report and Written Opinion from PCT/CN2011/082421, issued Apr. 5, 2012 and Mar. 22, 2012, respectively.

*Primary Examiner* — Mary Wilczewski
(74) *Attorney, Agent, or Firm* — Westman, Champlin & Koehler, P.A.

(57) ABSTRACT

The present disclosure provides a method for manufacturing a semiconductor field effect transistor, comprising: forming a semiconductor substrate having a local Silicon-on-Insulator (SOI) structure, which comprises a local buried isolation dielectric layer; forming a fin on a silicon substrate above the local buried isolation dielectric layer; forming a gate stack structure on a top and on side faces of the fin; forming source/drain structures in the fin at both sides of the gate stack structure; and metallizing. The present disclosure uses a conventional top-to-bottom process based on quasi-plane, which has a good compatibility with CMOS planar processes. Also, the method can suppress short channel effects and help to reduce the dimensions of MOSFETs.

11 Claims, 3 Drawing Sheets

(56) References Cited

U.S. PATENT DOCUMENTS

| | | | |
|---|---|---|---|
| 6,909,151 B2* | 6/2005 | Hareland et al. | 257/369 |
| 6,911,383 B2* | 6/2005 | Doris et al. | 438/588 |
| 6,949,768 B1* | 9/2005 | Anderson et al. | 257/74 |
| 7,256,078 B2* | 8/2007 | Anderson et al. | 438/157 |
| 7,300,837 B2* | 11/2007 | Chen et al. | 438/213 |
| 7,352,025 B2* | 4/2008 | Anderson et al. | 257/314 |
| 7,473,946 B2* | 1/2009 | Anderson et al. | 257/255 |
| 7,564,081 B2* | 7/2009 | Zhu et al. | 257/288 |
| 7,667,271 B2* | 2/2010 | Yu et al. | 257/347 |
| 7,696,040 B2* | 4/2010 | Zhu | 438/239 |
| 7,902,000 B2* | 3/2011 | Anderson et al. | 438/149 |
| 8,039,843 B2* | 10/2011 | Inaba | 257/64 |
| 8,207,027 B2* | 6/2012 | Zhu et al. | 438/176 |
| 8,378,429 B2* | 2/2013 | Chang et al. | 257/390 |
| 8,389,367 B2* | 3/2013 | Zhou et al. | 438/283 |
| 8,455,313 B1* | 6/2013 | Basker et al. | 438/197 |
| 8,466,012 B1* | 6/2013 | Chang et al. | 438/149 |
| 2006/0027870 A1* | 2/2006 | Inaba | 257/353 |
| 2007/0085134 A1* | 4/2007 | Anderson et al. | 257/326 |
| 2009/0072276 A1* | 3/2009 | Inaba | 257/255 |
| 2011/0175165 A1* | 7/2011 | Yu et al. | 257/347 |
| 2012/0329218 A1* | 12/2012 | Zhou et al. | 438/166 |
| 2013/0134515 A1* | 5/2013 | Zhou et al. | 257/347 |
| 2013/0134516 A1* | 5/2013 | Zhou et al. | 257/347 |
| 2013/0270560 A1* | 10/2013 | Cheng et al. | 257/57 |
| 2013/0320294 A1* | 12/2013 | Cappellani et al. | 257/9 |

* cited by examiner

METHOD FOR MANUFACTURING SEMICONDUCTOR FIELD EFFECT TRANSISTOR

This application is a National Phase application of, and claims priority to, PCT Application No. PCT/CN2011/082421, filed on Nov. 18, 2011, entitled "METHOD FOR MANUFACTURING SEMICONDUCTOR FIELD EFFECT TRANSISTOR", which claimed priority to Chinese Application No. 201110172967.4, filed on Jun. 24, 2011. Both the PCT Application and Chinese Application are incorporated herein by reference in their entireties.

TECHNICAL FIELD

The present disclosure pertains to the technical field of semiconductor. In particular, the present disclosure pertains to a method for manufacturing a bulk-silicon Fin Field Effect Transistor.

BACKGROUND

With the integrated circuit industry developing in accordance with the Moore Rule, feature dimension of CMOS devices continuously decreases, which poses various challenges to planar bulk-silicon CMOS devices. Various devices with new structures have been developed to conquer these challenges. Among these new structure devices, Fin Field Effect Transistors (FinFETs) have been considered to be one of the most promising candidates to replace the planar bulk-silicon CMOS devices. The FinFETs become a research focus all over the world.

Initially, the FinFET devices are mainly manufactured on SOI substrates, and their manufacturing process is simpler than that for bulk-silicon substrates. However, SOI FinFETs have drawbacks such as high manufacturing costs, inferior heat dissipation performance, floating-body effect, and bad compatibility with CMOS processes. In order to overcome the drawbacks of the SOI FinFETs, researches have been done on using bulk-silicon substrates in manufacturing the FinFET devices, which are called Bulk FinFETs. Products such as DRAM and SRAM based on the Bulk FinFETs have been put into use. However, typical Bulk FinFET devices have some drawbacks compared with SOI FinFET devices in that SCE suppressing effect is not ideal. Furthermore, leakage current is large due to leakage current paths in fins at channel bottom, and control of impurity profile is difficult.

In view of the foregoing problems, more work needs to be done to expedite the application of the FinFET devices. This is of great importance to the application of the FinFET devices and development of the semiconductor industry.

SUMMARY

The present disclosure provides, among other things, a novel method for manufacturing a bulk-silicon FinFET, which is easy to be integrated and has a good compatibility with planar COMS processes.

According to the present disclosure, a method comprises: forming a semiconductor substrate having a local Silicon-on-Insulator (SOI) structure, which comprises a local buried isolation dielectric layer; forming a fin on a silicon substrate above the local buried isolation dielectric layer; forming a gate stack structure on a top and side faces of the fin; forming source/drain structures in the fin at both sides of the gate stack structure; and metallizing.

Optionally, forming the semiconductor substrate having the local Silicon-on-Insulator (SOI) structure, which comprises the local buried isolation dielectric layer, may comprise: forming a dielectric layer on the semiconductor substrate; forming a dielectric layer island by photolithograph and etching the dielectric layer; forming a layer of amorphous silicon material on the semiconductor substrate; converting the amorphous silicon material into a monocrystal material and polishing the monocrystal material by Chemical Mechanical Polishing (CMP), to form the semiconductor substrate having the local Silicon-on-Insulator (SOI) structure.

Optionally, the dielectric layer may comprise any one of $SiO_2$, TEOS, LTO, and $Si_3N_4$. Optionally, the dielectric layer may have a thickness of about 20-100 nm. Optionally, in forming the layer of amorphous silicon material on the semiconductor substrate, the amorphous silicon material may be formed by Low Pressure Chemical Vapor Deposition (LPCVD) or Ion Beam Sputtering, etc. The amorphous silicon material may have a thickness of about 200 nm-1000 nm.

Optionally, in the step of converting the amorphous silicon material into the monocrystal material and polishing the monocrystal material by Chemical Mechanical Polishing (CMP), to form the semiconductor substrate having the local Silicon-on-Insulator (SOI) structure, the amorphous silicon material may be converted into the monocrystal material by any one of Lateral Solid Phase Epitaxy (LSPE), Laser Recrystallization, and Halogen Lamp or Stripe Heater Recrystallization, etc.

Optionally, forming the fin on the silicon substrate above the local buried isolation dielectric layer may comprise: exposing positive resist by electron beam lithography; etching the silicon substrate above the local buried isolation dielectric layer in such a way that the etching stops at the local buried isolation dielectric layer to form at least two trenches in the semiconductor substrate, between which trenches the fin is formed.

Optionally, the fin may have a thickness of about 10-60 nm.

Optionally, forming the gate stack structure on the top and on the side faces of the fin may comprise: forming a gate dielectric layer and a gate electrode material on the top and the side faces of the fin; and forming the gate electrode stack structure by photolithograph and etching.

Optionally, before forming the source/drain structures in the fin at both sides of the gate stack structure, the method may further comprise: forming source/drain extension regions or halo implantation regions in the fin by tilt angle ion implantation.

Optionally, forming the source/drain structures in the fin at both sides of the gate stack structure may comprise: forming spacers at both sides of the fin; forming source/drain doping regions by ion implantation; and forming source/drain silicide.

Optionally, the semiconductor substrate may be a bulk-silicon substrate.

The present disclosure at least has the following beneficial effects.

1. According to the method for manufacturing the semiconductor field effect transistor provided by the present disclosure, FinFET devices can be manufactured on the bulk-silicon substrate, so that self-heating effect and floating-body effect of SOI FinFET devices can be avoided and manufacturing cost can be reduced.

2. According to the method for manufacturing the semiconductor field effect transistor provided by the present disclosure, it is easy to form the local SOI structure on the bulk-silicon substrate and manufacture the fin structure isolated from the substrate. Therefore, the difficulty for manufacturing Bulk FinFET devices can be greatly reduced.

3. According to the method for manufacturing the semiconductor field effect transistor provided by the present disclosure, the manufacturing processes are simple and easy to be integrated, and have a good compatibility with planar CMOS processes.

BRIEF DESCRIPTION OF THE DRAWINGS

The foregoing and other objects, features, and advantages of the present disclosure will become more apparent from the detailed description on embodiments of the present disclosure with reference to the drawings, wherein.

REFERENCE SIGNS

Figure 1:
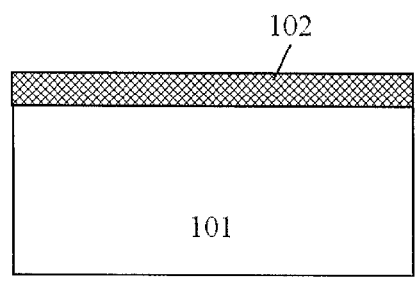
FIGS. 1~7 schematically show cross-sectional views of various structures in a process for manufacturing a semiconductor field effect transistor by a method according to embodiments of the present disclosure.

101: Si substrate; 102: dielectric layer; 103: amorphous silicon layer; 104: STI isolation layer; 105: trench structure; 106: fin; 107: gate dielectric layer; and 108: gate electrode.

It should be noted that the drawings are not drawn to scale and are only provided for purpose of illustration. The drawings therefore should not be interpreted as any limitation or restriction to the scope of the present disclosure. In the drawings similar parts are identified by similar reference signs.

DETAILED DESCRIPTION OF EMBODIMENTS

Next, the present disclosure will be described by specific embodiments shown in the drawings. However, it should be understood that these descriptions are only exemplary rather than intending to limit the scope of the present disclosure. Further, in the following description, explanations on well-known structures and technologies are omitted, in order not to unnecessarily obscure the concept of the present disclosure.

Schematic views of layer structures according to embodiments of the present disclosure are shown in the drawings. These drawings are not drawn to scale. Some details may be enlarged and some may be omitted for purpose of clarity. The respective regions, shapes of layers, as well as relative sizes and position relationships thereof are only exemplary, and may be varied due to manufacture tolerances or technique limitations in practice. Those skilled in the art may otherwise design region/layer having different shapes, sizes, or relative positions according to actual requirements.

FIGS. 1~7 schematically show cross-sectional views of various structures corresponding to respective steps for manufacturing a semiconductor device according to embodiments of the present disclosure in detail. The respective steps according to the embodiments of the present disclosure will be explained in detail with reference to the drawings.

First, as shown in FIG. 1, a dielectric layer 102 is formed on a semiconductor substrate 101. The dielectric layer 102 may comprise any one of $SiO_2$, TEOS, LTO, and $Si_3N_4$, or other dielectric materials. According to an embodiment of the present disclosure, the dielectric layer 102 may comprise $SiO_2$ and is formed by thermal growth. Optionally, the dielectric layer 102 may have a thickness of about 20-100 nm. The semiconductor substrate 101 may comprise any substrate material regularly used in semiconductor manufacturing. According to an embodiment of the present disclosure, the semiconductor substrate 101 may be a bulk-silicon substrate.

Figure 2A:
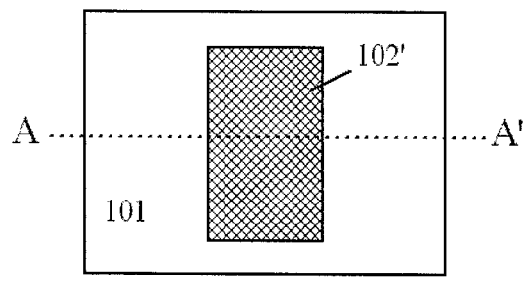
Figure 2B:
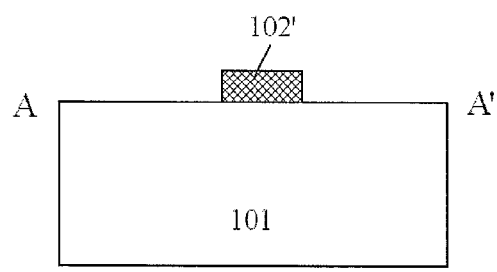

Next, as shown in FIG. 2A and FIG. 2B, a dielectric layer island 102' is formed on the semiconductor substrate 101. FIG. 2A is a schematic top view of the semiconductor substrate 101. FIG. 2B is a schematic cross-sectional view taken along an AA' direction. The dielectric layer island 102' may be formed by photolithograph or exposing resist by electron beam followed by Reaction Ion Etching.

Figure 3:
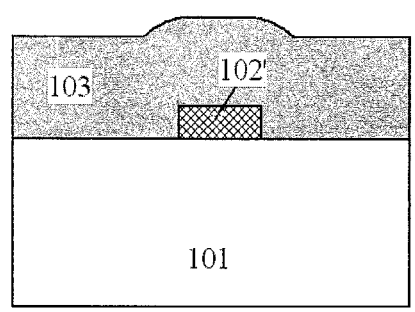

FIG. 3 schematically shows an amorphous silicon layer 103 being formed on the semiconductor substrate. The amorphous silicon layer 103 may be formed by Low Pressure Chemical Vapor Deposition (LPCVD) or Ion Beam Sputtering, etc. According to an embodiment of the present disclosure, the amorphous silicon layer 103 may be formed by LPCVD. The amorphous silicon layer 103 may have a thickness of about 200 nm-1000 nm.

Figure 4:
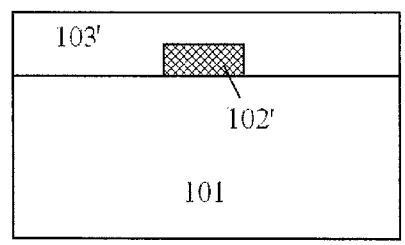

Next, as shown in FIG. 4, the amorphous silicon layer 103 is converted into a monocrystal silicon layer 103'. The monocrystal silicon layer 103' is polished by Chemical Mechanical Polishing (CMP), to form a semiconductor substrate having a local Silicon-on-Insulator (SOI) structure, which comprises a local buried isolation dielectric layer. The amorphous silicon layer 103 may be converted into the monocrystal layer 103' by any one of: Lateral Solid Phase Epitaxy (LSPE), Laser Recrystallization, and Halogen Lamp or Stripe Heater Recrystallization, etc. According to an embodiment of the present disclosure, the amorphous silicon layer 103 may be converted into the monocrystal layer 103' by Lateral Solid Phase Epitaxy (LSPE). In the LSPE process, the amorphous silicon layer 103 in direct contact with the semiconductor substrate 101 is subjected to Vertical Solid Phase Epitaxy in a vertical direction to be converted into the monocrystal silicon layer 103'. Then the amorphous silicon layer 103 covering the dielectric layer island 102' is subjected to Lateral Solid Phase Epitaxy to be converted into the monocrystal silicon layer 103'. Finally, the total amorphous silicon layer 103 is converted into the monocrystal silicon layer 103'.

Figure 5:
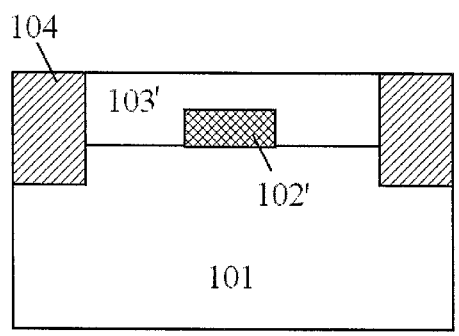

Next, as shown in FIG. 5, an STI isolation structure 104 is formed on the semiconductor substrate 101.

Figure 6A:
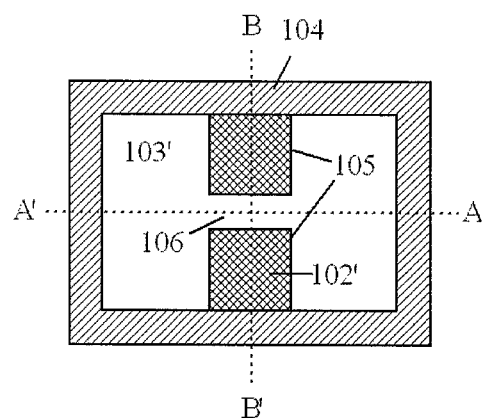
Figure 6B:
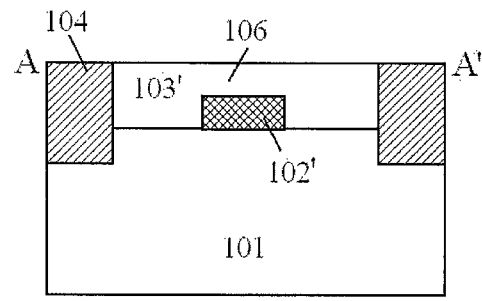
Figure 6C:
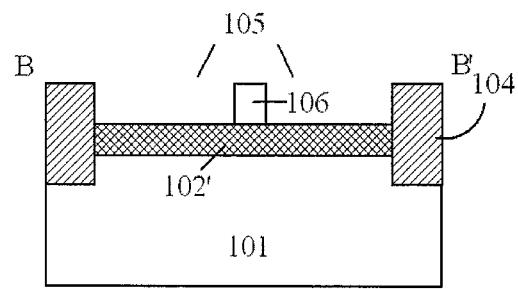

FIG. 6A is a schematic top view of the semiconductor substrate 101. FIG. 6B and FIG. 6C are schematic cross-sectional views taken along an AA' direction and a BB' direction in FIG. 6A, respectively. As shown in FIG. 6B and FIG. 6C, the monocrystal silicon layer 103' is etched to form trenches 105. A fin 106 is formed between two adjacent trenches. The trenches 105 may be formed, e.g., by exposing positive resist with electron beam followed by Reaction Ion Etching, so as to form the steep trenches 105 having a width of about 200-400 nm. The shape of the trenches is only exemplary. The present disclosure is not limited thereto. The fin has a thickness of about 10-60 nm.

Figure 7A:
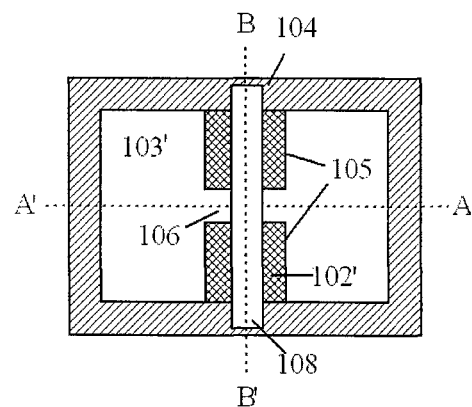
Figure 7B:
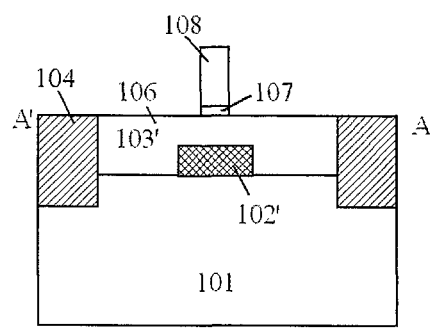
Figure 7C:
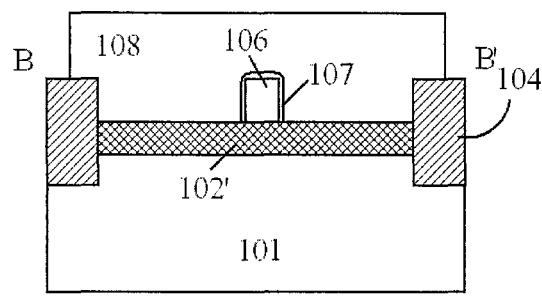

Next, as shown in FIGS. 7A, 7B, and 7C, a gate dielectric layer material 107 and a gate electrode material 108 are formed on the whole substrate, which are then etched to form a gate electrode stack structure. FIG. 7A is a schematic top view of the semiconductor substrate 101. FIG. 7B and FIG. 7C are schematic cross-sectional views taken along an AA' direction and a BB' direction in FIG. 7A, respectively. The gate dielectric layer material 107 may be any common gate dielectric material, such as $SiO_2$, or other high-K dielectric materials, such as any one of SiON, HfAlON, HfTaON, HfSiON, and $Al_2O_3$, etc. According to an embodiment of the present disclosure, the gate dielectric layer material 107 may be HfSiON formed by any one of Low Pressure Chemical Vapor Deposition, Metal Organic Chemical Vapor Deposition, and Atom Layer Deposition. The gate dielectric may have an equivalent oxide thickness of about 5-100 Å. The gate electrode material 108 may be any one of: refractory metals such as W, Ti, Ta, Mo; metal nitrides such as TiN, TaN, HfN, MoN, etc.; and other materials. The gate electrode material may be formed by any one of Low Pressure Chemical Vapor Deposition, Metal Organic Chemical Vapor Deposition, and Atom Layer Deposition, etc. The gate electrode material may have a thickness of about 2000-5000 Å.

Optionally, after forming the gate stack structure, the method may further comprise: forming source/drain extension regions in the fin by tilt angle ion implantation; or forming halo implantation regions in the fin by tilt angle ion implantation.

Next, gate spacers may be formed at sidewalls of the gate stack in accordance with regular methods. A detailed explanation thereof is omitted.

Next, source/drain regions may be formed by ion implantation in the semiconductor substrate on both sides of the gate stack. Also, source/drain silicide is formed.

Then, interconnection structures are formed by metallization in accordance with regular methods to elicit electrodes. A detailed explanation thereof is omitted.

According to the present disclosure, FinFET devices can be manufactured on a bulk-silicon substrate. The method uses a conventional top-to-bottom process based on quasi-plane, which is simple and has a good compatibility with CMOS planar processes. The method is also easy to be integrated.

In the above description, technique details such as patterning and etching of respective layers are not specifically explained. However, those skilled in the art will understand that the layers and regions, etc. having desired shapes may be formed by various approaches in the prior art. Further, those skilled in the art may design a method not completely the same as above to form a same structure.

The present disclosure has been described with reference to embodiments thereof. However, these embodiments are only exemplary rather than limiting the scope of the present disclosure. The scope of the disclosure is limited by the attached claims and equivalents thereof. Those skilled in the art may make various substitutions and modifications without departing from the scope of the present disclosure. All these substitutions and modifications fall within the scope of the present disclosure.

What is claimed is:

1. A method for manufacturing a semiconductor field effect transistor, comprising:
   forming a local Silicon-on-Insulator (SOI) structure, which comprises a semiconductor substrate, a local buried isolation dielectric island above the semiconductor substrate, and a silicon layer covering a top surface and side surfaces of the local buried isolation dielectric island;
   forming a fin from a portion of the silicon layer above the local buried isolation dielectric island;
   forming a gate stack structure on a top and on side faces of the fin;
   forming source/drain structures in the fin at both sides of the gate stack structure; and
   metallizing.

2. The method according to claim 1, wherein forming the local Silicon-on-Insulator (SOI) structure comprises:
   forming a dielectric layer on the semiconductor substrate;
   forming the dielectric layer island by photolithograph and etching the dielectric layer;
   forming a layer of amorphous silicon material on the semiconductor substrate; and
   converting the amorphous silicon material into a monocrystal material and polishing the monocrystal material by Chemical Mechanical Polishing (CMP), to form the local Silicon-on-Insulator (SOI) structure.

3. The method according to claim 2, wherein the dielectric layer comprises any one of $SiO_2$, TEOS, LTO, and $Si_3N_4$, and has a thickness of about 20-100 nm.

4. The method according to claim 2, wherein:
   in forming the layer of amorphous silicon material on the semiconductor substrate, the amorphous silicon material is formed by Low Pressure Chemical Vapor Deposition (LPCVD) or Ion Beam Sputtering; and
   the amorphous silicon material has a thickness of about 200 nm-1000 nm.

5. The method according to claim 2, wherein in converting the amorphous silicon material into the monocrystal material and polishing the monocrystal material by Chemical Mechanical Polishing (CMP), the amorphous silicon material is converted into the monocrystal material by any one of Lateral Solid Phase Epitaxy (LSPE), Laser Recrystallization, and Halogen Lamp or Stripe Heater Recrystallization.

6. The method according to claim 1, wherein forming the fin from the silicon layer comprises:
   exposing positive resist by electron beam; and
   etching the silicon layer above the local buried isolation dielectric island in such a way that the etching stops at the local buried isolation dielectric island to form at least two trenches in the silicon layer, between which trenches the fin is formed.

7. The method according to claim 6, wherein the fin has a thickness of about 10-60 nm.

8. The method according to claim 1, wherein forming the gate stack structure on the top and on the side faces of the fin comprises:
   forming a gate dielectric layer and a gate electrode material on the top and the side faces of the fin; and
   forming the gate electrode stack structure by photolithograph and etching.

9. The method according to claim 1, wherein before forming the source/drain structures in the fin at both sides of the gate stack structure, the method further comprises forming source/drain extension regions or halo implantation regions in the fin by tilt angle ion implantation.

10. The method according to claim 1, wherein forming the source/drain structures in the fin at both sides of the gate stack structure comprises:
    forming spacers at both sides of the fin;
    forming source/drain doping regions by ion implantation; and
    forming source/drain silicide.

11. The method according to claim 1, wherein the semiconductor substrate is a bulk-silicon substrate.

* * * * *